US009182617B2

(12) United States Patent
Tatsumi et al.

(10) Patent No.: US 9,182,617 B2
(45) Date of Patent: Nov. 10, 2015

(54) DRIVER CIRCUIT CONFIGURED WITH TRAVELLING WAVE AMPLIFIER

(71) Applicant: Sumitomo Electric Industries, Ltd., Osaka (JP)

(72) Inventors: Taizo Tatsumi, Yokohama (JP); Sosaku Sawada, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 163 days.

(21) Appl. No.: 13/785,507

(22) Filed: Mar. 5, 2013

(65) Prior Publication Data

US 2013/0229699 A1    Sep. 5, 2013

(30) Foreign Application Priority Data

Mar. 5, 2012 (JP) .................................. 2012-048375

(51) Int. Cl.
| | |
|---|---|
| H04B 10/00 | (2013.01) |
| H01S 3/00 | (2006.01) |
| H01P 1/04 | (2006.01) |
| H03F 3/38 | (2006.01) |
| H03F 3/45 | (2006.01) |
| H03B 1/00 | (2006.01) |
| G02F 1/01 | (2006.01) |
| H03K 5/159 | (2006.01) |
| H03F 3/60 | (2006.01) |

(Continued)

(52) U.S. Cl.
CPC .......... *G02F 1/0121* (2013.01); *H03F 3/45085* (2013.01); *H03F 3/605* (2013.01); *H03K 5/159* (2013.01); *H03F 3/04* (2013.01); *H03K 5/06* (2013.01); *H04B 10/2914* (2013.01); *H04B 10/588* (2013.01); *H04B 2210/254* (2013.01); *H04J 3/0682* (2013.01)

(58) Field of Classification Search
CPC ..................... H04B 2210/254; H04B 10/2914; H04B 10/588; H04J 3/0682; H03K 5/06
USPC ............ 359/344; 398/53, 161, 164, 172, 183, 398/187, 210, 58; 333/254, 260, 18, 19, 333/156, 164, 165; 330/10, 252, 255, 267, 330/280, 310, 311; 327/108, 161, 261, 277, 327/395
See application file for complete search history.

(56) References Cited

U.S. PATENT DOCUMENTS

2009/0243718 A1 * 10/2009 Bonthron ...................... 330/10

FOREIGN PATENT DOCUMENTS

| JP | 02-301205 A | 12/1990 |
|---|---|---|
| JP | 03-188705 A | 8/1991 |

(Continued)

OTHER PUBLICATIONS

Notice of Reasons for Rejection in Japanese Patent Application No. 2012-048375, dated Jul. 21, 2015.

*Primary Examiner* — Evelyn A Lester
(74) *Attorney, Agent, or Firm* — Venable LLP; Michael A. Sartori; F. Brock Riggs

(57) ABSTRACT

A driver with the arrangement of the travelling wave amplifier is disclosed. The driver provides n counts of cells each configuring the open collector arrangement and amplifying an input signal. The cells are arranged between an input interconnection and an output interconnection, and powered through the output interconnection. The power supply line to power the output interconnection is connected between m-th and (m+1)-th cells not through the output terminal of the output interconnection.

13 Claims, 16 Drawing Sheets

(51) Int. Cl.
*H04J 3/06* (2006.01)
*H04B 10/588* (2013.01)
*H04B 10/291* (2013.01)
*H03K 5/06* (2006.01)
*H03F 3/04* (2006.01)

(56) References Cited

FOREIGN PATENT DOCUMENTS

JP 09-130170 A 5/1997
JP 09-162658 A 6/1997

* cited by examiner

DRIVER CIRCUIT CONFIGURED WITH TRAVELLING WAVE AMPLIFIER

BACKGROUND OF THE INVENTION

1. Field of the Invention

The present invention relates to a driver for driving a semiconductor optical modulator.

2. Related Background Art

A traveling wave amplifier (hereafter denoted as "TWA") has been well known in the field. A TWA generally provides a plurality of cells each connected in parallel between the input interconnection and the output interconnection and amplifying an input signal coming therein with an input delay time specific to the cell and output an amplified signal to the output terminal with an output delay time also specific to the cell. But the sum of the input delay time and the output delay time is common to respective cells; accordingly, the output signal may be kept in the waveform thereof. The cells are powered through the output interconnection.

When an TWA is utilized in an optical communication, in particular, when an TWA drives an optical modulator types of an electro-absorption (hereafter denoted as "EA") modulator or a Mach-Zehnder (hereafter denoted as "MZ") modulator, a substantial amplitude of the output signal is required, which increases a driving current flowing in the driver. A TWA generally requires delay lines. When the driving current with the substantial amplitude flows in the delay lines, the delay lines are inevitable to be widened in dimensions thereof, which enlarges a size of the TWA.

SUMMARY OF THE INVENTION

One aspect of the present application relates to a driver to modulate continuous light coming from an optical source. The driver includes an input interconnection to propagate an input signal, an output interconnection to propagate amplified signals, first to N-th cells each connected between the input interconnection and the output interconnection, and a power line to supply electrical power to the cells through the output interconnection.

The input interconnection provides first to N-th input delay lines connected in series and each of the input delay lines has a delay time substantially equal to each other. The output interconnection also provides first to N-th output delay lines connected in series and each of the output delay lines has a delay time substantially equal to each other and equal to the delay time of the input delay line. The n-th cell, where n is an integer between 1 and N, is connected between the n-th input delay line and the n-th output delay line. A feature of the driver of an embodiment is that the power line is connected between the m-th output delay line and (m+1)-th output delay line, where m is an integer between 2 to N−2.

Another aspect of the present application relates to a transmitting module that includes an optical source, an optical modulator, and a driver. The optical source that includes a semiconductor laser diode (hereafter denoted as "LD") emits continuous light. The optical modulator modulates the continuous light by receiving a driving signal from the driver. The driver, which is configured with the TWA, includes an input interconnection, an output interconnection, first to N-th cells, and a power line. The input interconnection provides first to N-th input delay lines. The output interconnection provides first to N-th output delay lines. The n-th cell is connected between the n-th input delay line to receive an input signal and the n-th output delay line to output an amplified signal, where n is an integer between 1 and N. A feature of the transmitting module is that the power line is connected between the m-th output delay line and (m+1)-th output delay line, where m is an integer between 2 to N−2, to supply electrical power to the cells through the output interconnection.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF THE PREFERRED EMBODIMENTS

Next, some preferred embodiments according to the present invention will be described as referring to drawings. In the description of the drawings, numerals or symbols same with or similar to each other will refer to the elements same with or similar to each other without overlapping explanations.

Figure 1:
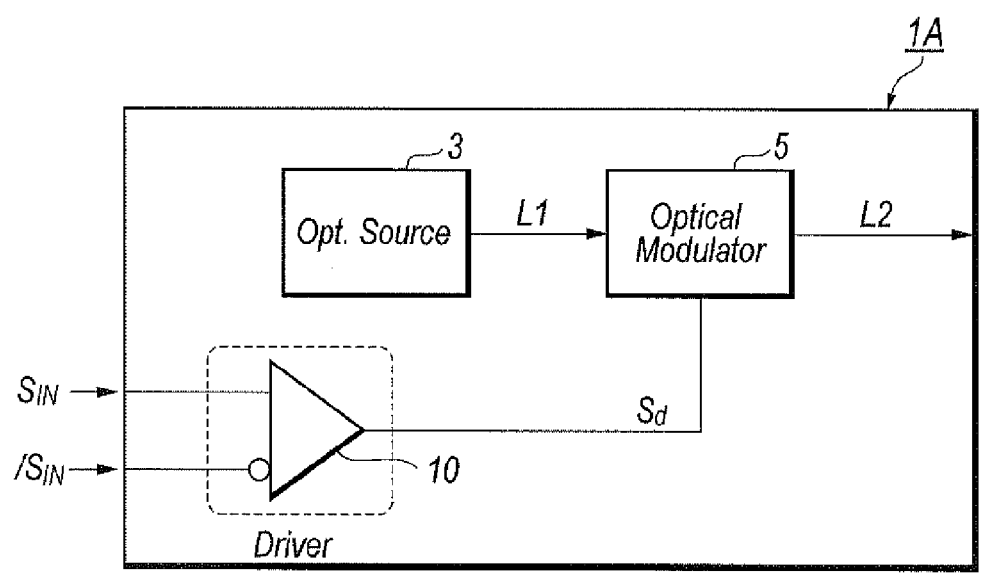
FIG. 1 is a functional block diagram of a optical transmitting module installing a driver according to an embodiment of the invention.

FIG. 1 is a functional block diagram of an optical transmitting module implemented with a driver according to one embodiment of the present invention. The optical transmitting module 1A shown in FIG. 1 includes an optical source 3, an optical modulator 5, and a driver 10. The optical source 3, which may be a semiconductor-light-emitting device, typically, a semiconductor laser diode (hereafter denoted as "LD"), that emits light L1 with a preset wavelength. The optical modulator 5, which is optically coupled with the optical source 3, modulates the continuous wave light L1 to generate modulated light L2. The optical modulator 5 may be a type of EA or MZ. The modulated light L2 includes signals of high frequency components exceeding 10 GHz, typically reaching 25 Gbps or 40 Gbps. The modulated light L2 is guided to an external from the optical transmitting module 1A.

The driver 10, which drives the optical modulator 5, amplifies signals, $S_{IN}$ and $/S_{IN}$, provided in input terminals to output a driving signal $S_d$ to the optical modulator 5. The symbol slash "/" means that signal denoted by the symbol has a phase opposite to a signal denoted by a symbol without the slash. The optical modulator 5 modulates the continuous light L1 by the driving signal $S_d$. The driver 10 of the present embodiment has the arrangement of, what is called, the differential arrangement that processes two signals $S_{IN}$ and $/S_{IN}$ complementary to each other; however, the signal $S_{IN}$ and the driving signal $S_d$ may be a single phase signal.

Figure 2:
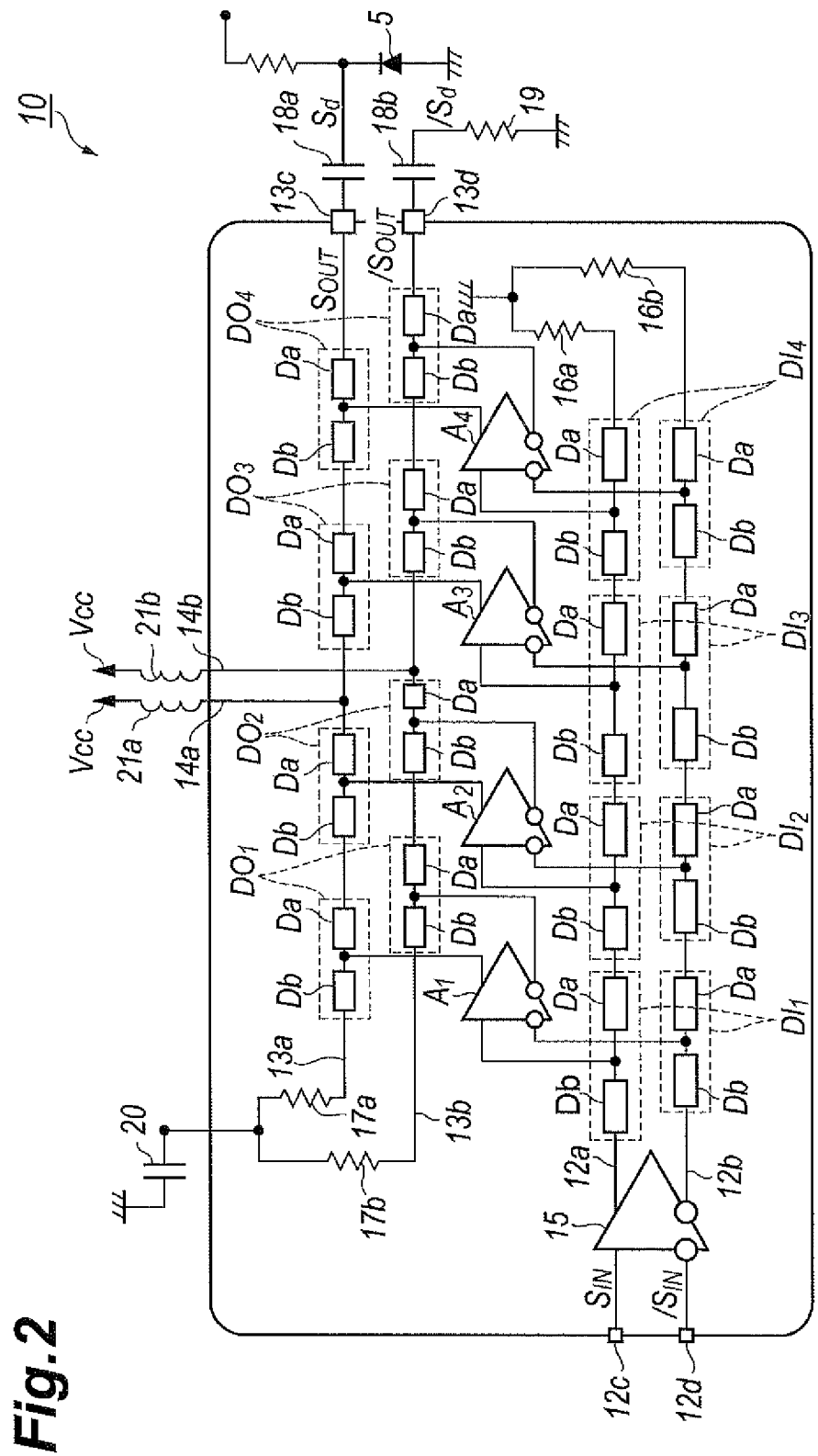
FIG. 2 shows a circuit diagram of a driver according to an embodiment of the invention.

FIG. 2 shows a circuit diagram of the driver 10. The driver 10, which may have the configuration of the TWA includes a pair of input interconnections, 12a and 12b, a pair of output interconnections, 13a and 13b, a plurality of cells, $A_1$ to $A_N$, where N is an integer greater than unity, where the driver 10 shown in FIG. 2 has four (4) cells, input delay lines, $DI_1$ to $DI_N$, output delay lines, $DO_1$ to $DO_N$, and a pair of power lines, 14a and 14b. These circuit elements described above are integrated on a semiconductor substrate, such as InP substrate.

The input interconnections, 12a and 12b, each transmits signals, $S_{IN}$ and $/S_{IN}$, and extends along one direction on the substrate. The input interconnections, 12a and 12b, each has an input terminal, 12c and 12d, in one end thereof. As illustrated in FIG. 2, the driver 10 may further provide a pre-amplifier 15 to amplify the signals, $S_{IN}$ and $/S_{IN}$, in the end of the input interconnections, 12a and 12b. The input interconnections, 12a and 12b, are connected to the ground GND through resistors, 16a and 16b, in the other end thereof.

The output interconnections, 13a and 13b, each carries the amplified signals, $S_{OUT}$ and $/S_{OUT}$, and extends substantially in parallel to the input interconnections, 12a and 12b, on the substrate. The output interconnections, 13a and 13b, each provides the output terminal, 13c and 13d, to output the amplified signals, $S_{OUT}$ and $/S_{OUT}$, in the end thereof. The output terminal 13c is connected with one electrode of the optical modulator 5 through a coupling capacitor 18a, where the amplified signal $S_{OUT}$ output from the output terminal 13c is provided to the optical modulator 5 as the driving signal $S_d$. The other output terminal 13d provides the other amplified signal $/S_{OUT}$ to the ground through another coupling capacitor 18b and a resistor 19. The output interconnections, 13a and 13b, in the other end thereof, are grounded through respective resistors, 17a and 17b, and a capacitor 20 as illustrated in FIG. 2.

Each of cells, $A_1$ to $A_N$, amplifies the input signals, $S_{IN}$ and $/S_{IN}$, to generate the amplified signals, $S_{OUT}$ and $/S_{OUT}$. The cells, $A_1$ to $A_N$, according to the present embodiment have the configuration of, what is called, the differential circuit, and are connected in parallel between the input interconnections, 12a and 12b, and the output interconnections, 13a and 13b. Specifically, each of cells, $A_1$ to $A_N$, provides a pair of inputs connected to the input interconnections, 12a and 12b, and a pair of outputs connected to the output interconnections, 13a and 13b.

The input delay lines, $DI_1$ to $DI_N$, have the configuration of the transmission line having a specific delay time equal to each other. That is, one of the input interconnections 12a provides the input delay lines, $DI_1$ to $DI_N$, in series from the input end in this order; while, the other input interconnection 12b also provides the input delay lines, $DI_1$ to $DI_N$, in series from the input end in this order.

Each of the input delay lines, $DI_n$ (n=1 to N), includes two delay elements, Da and Db, connected in series each having a delay time substantially equal to each other; and a sum the delay times is the delay time of respective input delay lines $DI_n$ (n=1 to N). Specifically, each of delay lines $DI_n$ is coupled with an input of the cell $A_n$ such that a node between the delay elements, Da and Db, is connected to the input of the cell $A_n$. Accordingly, the first cell $A_1$ receives the signal output from the pre-amplifier 15 through the delay element Db, the second cell $A_2$ receives the signal through delay element Db twice and another delay element Da, the third cell $A_3$ receives the signal through the delay element Db three times and another delay element Da twice, and the fourth cell $A_4$ receives the signal through the delay element Db four times and another delay element Da three times. That is, a delay element Da in the m-th input delay line $DI_m$ and another delay element Db in the (m+1)-th input delay line $DI_{m+1}$ are put between the inputs of the cells, $A_m$ and $A_{m+1}$. In other words, the (m+1)-th cell $A_{m+1}$ receives the signals, $S_{IN}$ and $/S_{IN}$, output from the pre-amplifier 15 delayed by the delay elements, Da and Db, compared with the upstream cell $A_m$.

The output delay lines, $DO_1$ to $DO_N$, have an arrangement similar to the input delay lines, $DI_1$ to $DI_N$, described above. That is, the output delay lines, $DO_1$ to $DO_N$, have delay times same to each other, and formed in respective output interconnections, 13a and 13b. The delay time of the output delay lines, $DO_1$ to $DO_N$, is substantially equal to that of the input delay lines, $DI_1$ to $DI_N$.

In the present embodiment, each of the output delay lines $DO_n$ (n=1 to N) includes first and second elements, Da and Db, respectively. Two delay elements, Da and Db, have a delay time substantially same to each other; and a sum of the delay times is the delay time of respective output delay lines, $DO_1$ to $DO_N$. The fourth cell $A_4$ output the amplified signals to the output terminals, 13c and 13d, through the delay element Da in the fourth output delay lines $DO_4$, the third cell $A_3$ outputs the amplified signals to the output terminals, 13c and 13d, through the delay element Da twice and another delay element Db. The second cell $A_2$ outputs the amplified signals to the output terminals, 13c and 13d, through the delay element Da three times and another delay element Db twice. The first cell $A_1$ outputs the amplified signal to the output terminals, 13c and 13d, through the delay element Da four times and another delay element Db three times. That is, one delay element Da and one delay element Db are put between the outputs of the cells, $A_m$ and $A_{m+i}$, neighbor to each other.

Further specifically, the signals, $S_{IN}$ and $/S_{IN}$, output from the pre-amplifier 15 and output from the output terminals, 13c and 13d, after being amplified by the first cell $A_1$ are influenced by the delay element Da four times and another delay element Db four times; those amplified by the second cell $A_2$ are influenced by the delay element Da four times and another delay element Db four times; and those amplified by the third cell $A_3$ and those amplified by the fourth cell $A_4$ are influenced by the delay element Da four times and another delay element Db four times. Thus, assuming the cells, $A_1$ to $A_4$, show a propagation delay time same to each other, the amplified signals, $S_{OUT}$ and $/S_{OUT}$, appeared in the output terminals, 13c and 13d, are adequately recovered in the signal shape thereof even the paths are different from others.

The power lines, 14a and 14b, supply electrical power to respective cells, $A_1$ to $A_4$, through the output interconnections, 13a and 13b. The power lines, 14a and 14b, couples with the output interconnections, 13a and 13b, between the m-th output delay line $DO_m$ and (m+1)-th output delay line $DO_{m+1}$. When the number of the cell $A_m$ is even as the present embodiment shown in FIG. 4, where m is equal to 4, the power lines, 14a and 14b, are preferably to be connected just in the midpoint of the cells, that is, between the second cell $A_2$ and the third cell $A_3$. In a case where the driver provides the odd number of cells $A_m$, the power lines, 14a and 14b, are preferable connected to the output interconnections, 13a and 13b, around a midpoint of the cells, $A_1$ to $A_N$. For instance, the driver 10 includes five (5) cells, the power lines, 14a and 14b, are preferably connected to a point between the second and third cells, $A_2$ and $A_3$, or between the third and fourth cells, $A_3$ and $A_4$.

That is, assuming the driver 10 provides the N count of the cells, the power lines are preferably connected to the output interconnections, 13a and 13b, between the (N/2)-th cell and the (N/2+1)-th cell. In particular, the driver 10 provides an odd number N of the cells, the power lines, 14a and 14b, are preferably connected to the upstream or the downstream of the (INT(N/2)+1)-th cell, namely, between INT(N/2)-th and (INT(N/2)+1)-th cells, or between (INT(N/2)+1)-th and (INT(N/2)+2)-the cells, where "INT(N/2)" means that a maximum integer closest to a real number of N/2. Inductors, 21a and 21b, are preferably provided in the power lines, 14a and 14b, not to influence the transmission impedance of the output interconnections, 13a and 13b, and/or the delay time of the output delay lines, connected to the power lines, 14a and 14b.

Figure 3:
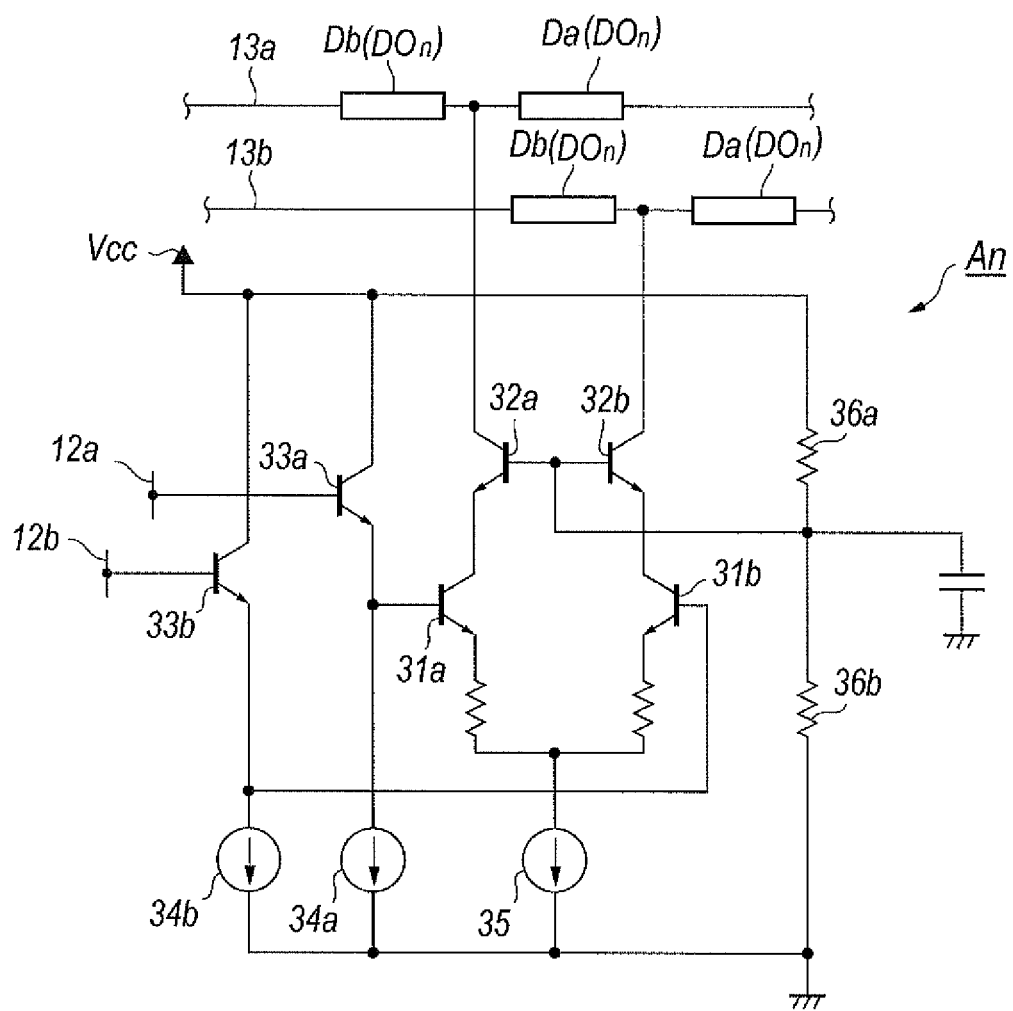
FIG. 3 shows a circuit diagram of a cell implemented within the driver shown in FIG. 2.

FIG. 3 shows an example of a circuit diagram of the cell $A_n$. FIG. 3 also shows the output delay lines $DO_n$ including two delay elements, Da and Db. As shown in FIG. 3, the cell $A_n$ includes a differential circuit of two transistors, 31a and 31b, two cascade transistors, 32a and 32b, and two emitter follower transistors, 33a and 33b. The transistors, 33a and 33b, as described above, constitute the emitter follower accompanied with the current sources, 34a and 34b, namely, the collector grounded configuration, whose bases receive the signals, $S_{IN}$ and $/S_{IN}$, delayed by accumulative input delay lines.

The transistors, 31a and 31b, constitute the differential circuit accompanied with the current source 35 commonly connected to the emitter of the transistors, 31a and 31b. The cascade transistors, 32a and 32b, whose bases are biased by a constant voltage generated by dividing the power supply Vcc by two resistors, 36a and 36b, which constitutes the base grounded configuration. That is, the emitters are connected to the collector of the differential circuit, 31a and 31b, while, the collector thereof are connected to the output delay lines, 13a and 13b, as an open collector configuration.

Figure 4:
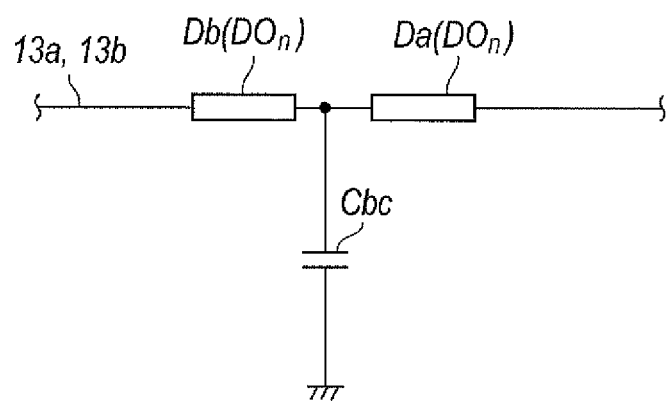
FIG. 4 shows an equivalent circuit diagram of the cell viewed from the output interconnections.

The transmission impedance of the output interconnections, 13a and 13b, may be determined by the delay elements, Da and Db, and the output capacitance of the cell $A_n$, which is primarily given by the collector-base capacitance of the cascade transistors, 32a and 32b. FIG. 4 shows an equivalent circuit of the output interconnections, 13a and 13b, and the cell $A_n$. When the transistors in the cell $A_n$ are integrally formed on a semiconductor substrate, the collector-base capacitance of such transistor inherently shows, for instance, about 20 fF.

Figure 5A:
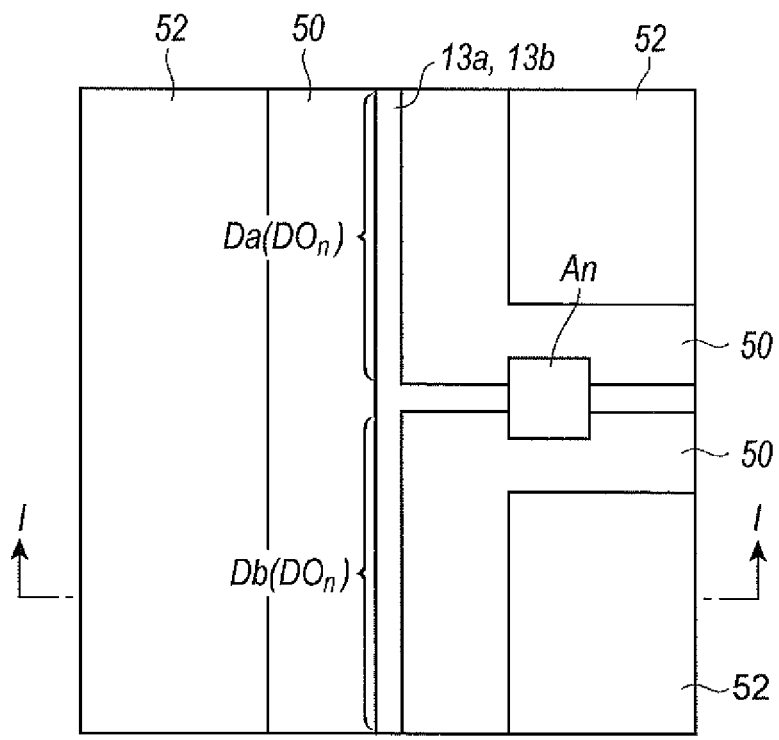
FIG. 5A is a plan view of the cell and two delay elements shown in FIG. 4; and, FIG. 5B shows a cross section taken along the line I-I appeared in FIG. 5A.
Figure 5B:
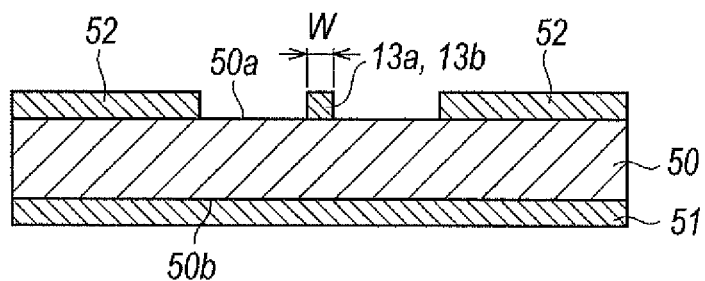
Figure 6:
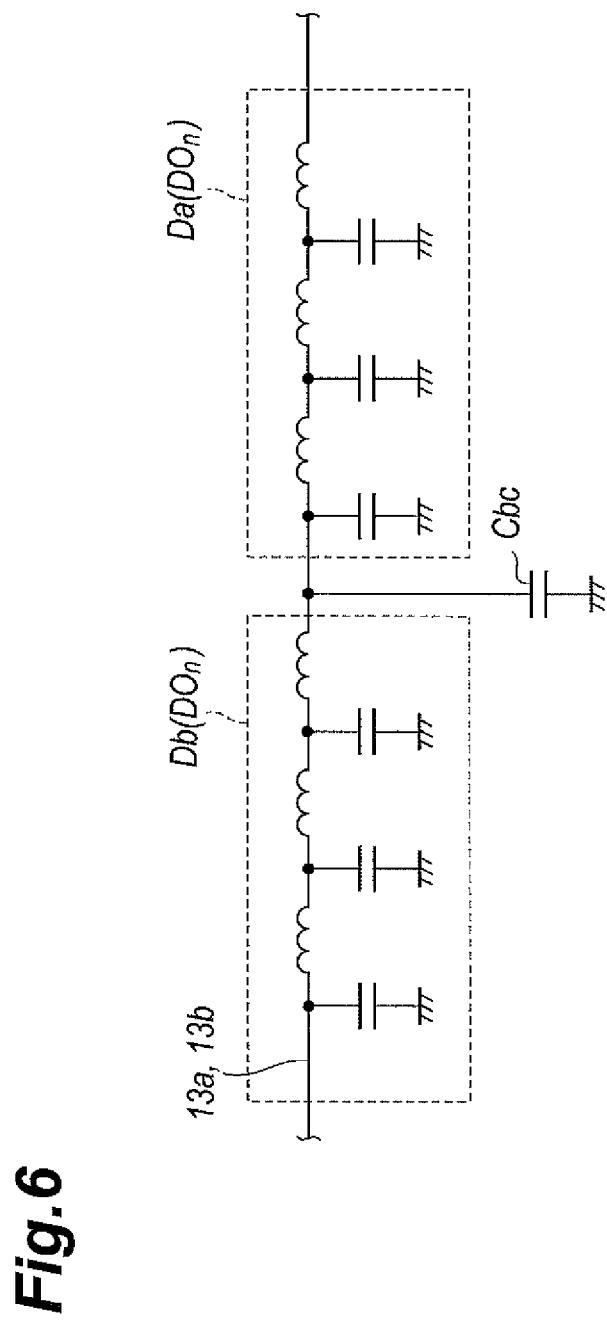
FIG. 6 shows an equivalent circuit of the output interconnections, 13a and 13b, each configured with a co-planar line.

As shown in FIGS. 5A and 5B, the output interconnections, $DO_1$ to $DO_N$, preferably have an arrangement of, what is called, the micro-strip line, or the co-planar line with the ground pattern 52, formed on the substrate 50. In the case of the co-planar line with the ground pattern, the substrate 50 in the top surface 50a thereof provides an interconnection 13a, or 13b with a preset width W, while the back surface 50b thereof provides a metal film 51 connected to a reference voltage, typically the ground. The top surface 50a further provides, in both sides of the interconnection 13a, or 13b, metal films 52 operating as the ground with a preset span against the interconnection 13a, or 13b. FIG. 6 shows an equivalent circuit of the output interconnections, 13a and 13b, each configured with a co-planar line.

The transmission impedance Z of the output interconnections, 13a and 13b, with the arrangement shown in FIGS. 5A and 5B, is given by:

$$Z=\{(C_{COP}+C_{bc})/L_{COP}\}^{1/2}, \quad (1)$$

where $C_{COP}$ is capacitance of the co-planar line, and $L_{COP}$ is inductance of the co-planar line. The impedance Z depends on the base-collector capacitance $C_{bc}$; accordingly, in order to design the transmission impedance of the output interconnections, 13a and 13b, accompanied with the cells $A_n$, it is necessary to design the bare impedance of the output interconnections, 13a and 13b, without any cells $A_n$ to be greater than 50 and secure the inductance $L_{COP}$ so as to close the transmission impedance to be equal to 50Ω. Generally, because the line inductance of an interconnection depends on the length and width of the interconnection, a substantial length of the transmission line is necessary to set the transmission impedance thereof to be equal to the preset range.

Figure 7:
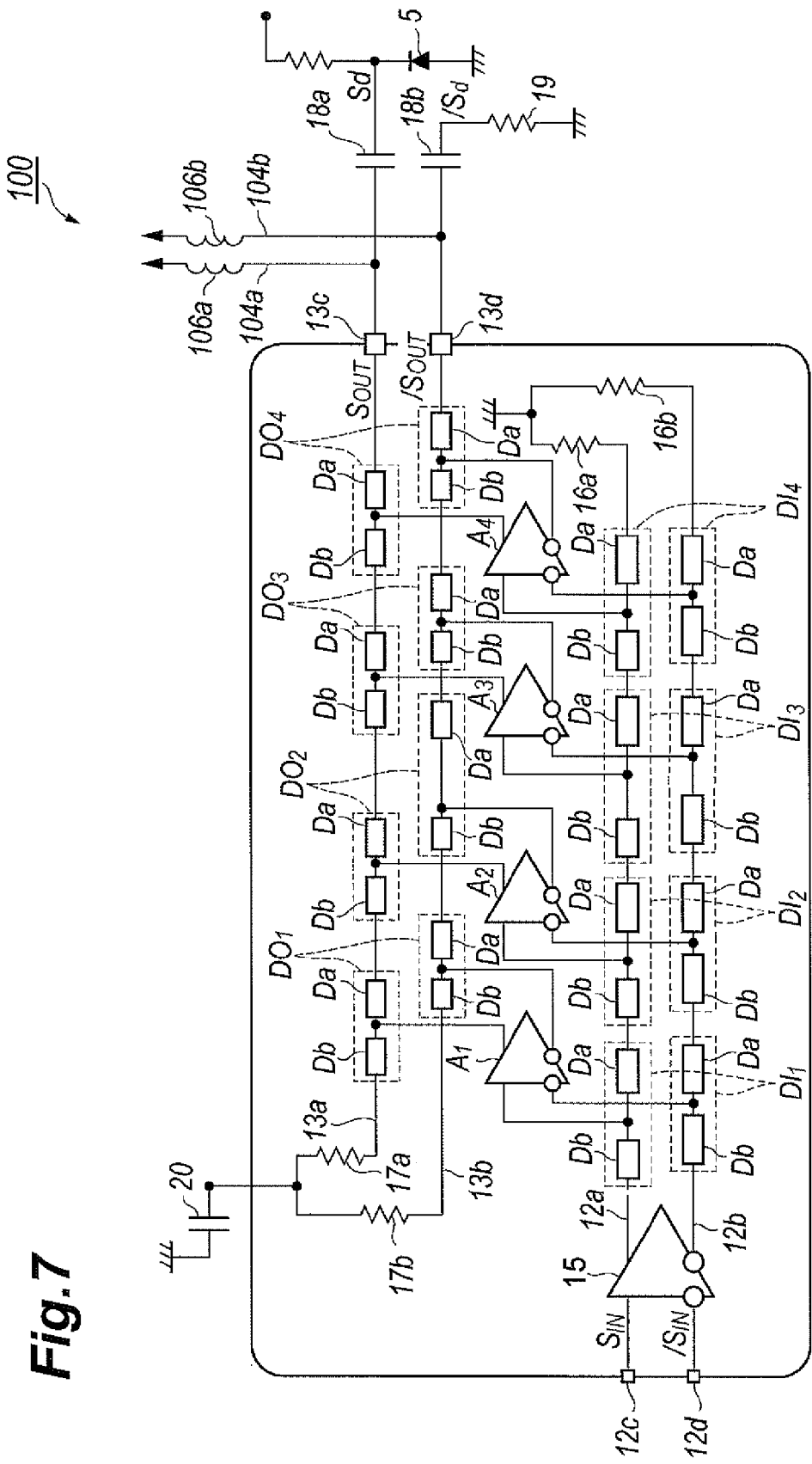
FIG. 7 is a circuit diagram of a driver according to a comparable embodiment of the invention.

FIG. 7 is a circuit diagram of a driver 100 according to a comparable embodiment of the invention. The driver 100 has an arrangement substantially same with those of the embodiment 10 shown in FIG. 2 except for the power lines, 104a and 104b, instead of the power lines, 14a and 14b. That is, the power lines, 104a and 104b, of the comparable embodiment shown in FIG. 7 supply power to the output interconnections, 13a and 13b, from the output terminals, 13c and 13d. The inductors, 106a and 106b, connected to the power supply are also provided in the power lines, 104a and 104b.

In the driver with the TWA arrangement, when the duty ratio of the output signal is 50%, the output amplitude $V_{OUT}$ and the output DC current Ioutdc have a relation of:

$$Ioutdc=V_{OUT}/(Z_{OUT}//Z_L), \quad (2)$$

where $Z_{OUT}$ and $Z_L$ are the output impedance of the driver and the impedance of the optical modulator, respectively. In equation (2), the symbol "//" means combined impedance of two elements putting this symbol therebetween that are connected in parallel to the others.

Figure 8:
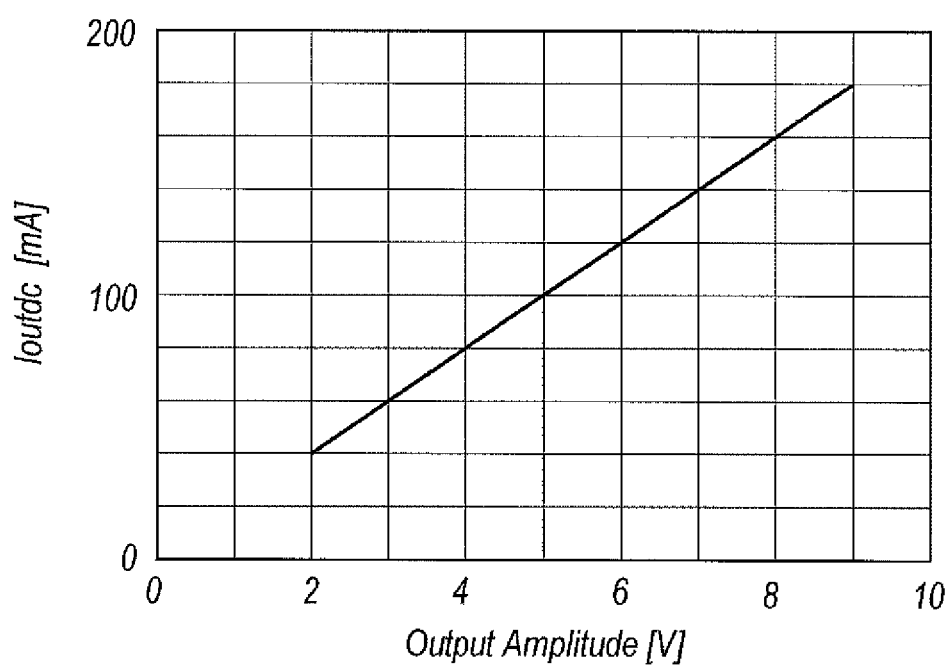
FIG. 8 shows a relation of the output DC current flowing into the driver against the output amplitude.

FIG. 8 shows the relation denoted by equation (2), that is, the horizontal axis of FIG. 8 corresponds to the output amplitude $V_{OUT}$, the vertical axis corresponds to the output DC current Ioutdc, and the slope of the behavior is given by $1/(Z_{OUT}/Z_L)$. The output amplitude $V_{OUT}$ of about 2 to 3.5 V is generally required for the modulator with a type of the EA, while, a larger amplitude of about 3.5 to 9 V is required for an MZ modulator. For such amplitudes, the output DC current Ioutdc of 40 to 180 mA is necessary.

In the driver 100 shown in FIG. 7, which has the power lines, 104a and 104b, connected in the output terminals, 13c and 13d, the output DC current Ioutdc supplied from the output terminals, 13c and 13d, flow in the delay element Da. A portion of the DC current is divided into the cell $A_4$, and a rest of the current flows into the next delay element Db. Iterating the division of the current into the cell $A_i$ and the rest of the current flowing into the next delay element Db, the current finally flows into the cell $A_1$. Accordingly, the output interconnections, 13a and 13b, or the delay elements, Da and Db, in the output delay lines $DO_4$ closest to the output terminals, 13c and 13d, are necessary to be formed wider to lower the series resistance thereof. However, widened patterns of the delay elements, Da and Db, are necessary to be formed longer to have the predetermined transmission impedance as described in FIG. 6. The driver 100 shown in FIG. 7 or that 10 shown in FIG. 2, when they are integrally formed on a semiconductor substrate, generally has a feature that the interconnections and delay lines occupy a dominant area to have the predetermined impedance and the predetermined delay time. Under such a condition, the widened delay elements, Da and Db, close to the output terminals, 13c and 13d, immediately brings a larger sized integrated circuit.

The driver 10 shown in FIG. 2 according to an embodiment of the invention, the power lines, 14a and 14b, are extracted between the m-th cell $A_m$ and the (m+1)-th cell $A_{m+1}$, where m is an integer greater than 1 but less than N−1, not the output terminals, 13c and 13d. Accordingly, the driver 10 of the embodiment reduces the current flowing in the output terminals, 13c and 13d, by at least (N−1)/N of the current Idcout. When the number of the cells is even, like the present embodiment where n is equal to four (4), the power lines, 14a to 14b, are preferably connected between the second and third cells, $A_2$ and $A_3$, then the current flowing in the output terminals, 13c and 13d, is reduced to a half of the current when the power lines are connected to the output terminals, 13c and 13d.

Figure 9A:
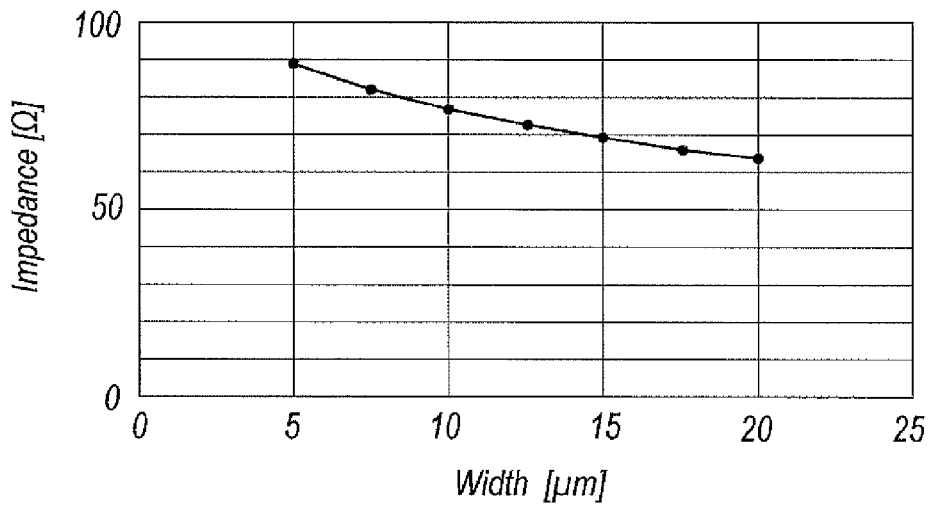
FIG. 9A shows a behavior of the transmission impedance of the delay line with respect to the width thereof.

FIG. 9A shows a behavior of the transmission impedance of the output delay lines, $DO_1$ to $DO_N$, with respect to the width thereof ignoring the base-collector capacitance Cbc inherently attributed to the output transistors, 32a and 32b, of the cell $A_n$. The horizontal scale is micron-meter (μm), while, that of the vertical axis is ohm (Ω). Moreover, FIG. 9A assumes that the substrate is made of InP with a thickness of 100 μm, output delay lines $DO_1$ to $DO_N$, has a thickness of 3 μm and a gap to the ground patterns in both sides thereof is 40 μm. As shown in FIG. 9A, the impedance thereof lowers as the width of the delay lines becomes wider.

Figure 9B:
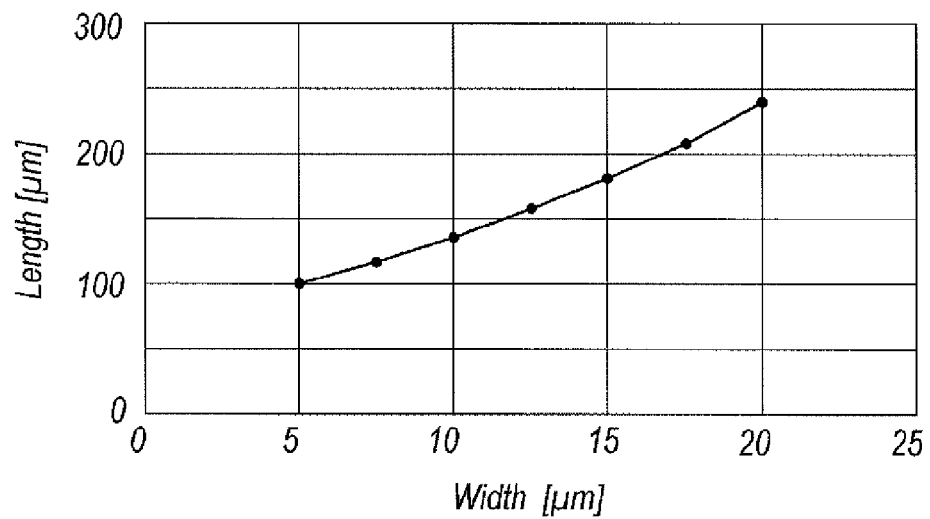
FIG. 9B shows a length of the delay line to have the preset transmission impedance against the width thereof.

On the other hand, FIG. 9B shows a length of the delay lines, $DO_1$ to $DO_N$, against the width thereof in order to have the transmission impedance of 50Ω. Horizontal axis shows the width of the delay lines, while, the vertical axis shows the length necessary to have the impedance of 50Ω. FIG. 9B takes into account the base-collector capacitance Cbc of the output transistors, 32a and 32b, of the cell $A_n$, which is assumed to be 20 fF. As shown in FIG. 9B, the widened delay line requests a lengthened pattern to have the predetermined transmission impedance.

A width of a transmission line is designed so as to have enough tolerance for the current flowing therein, namely, designed to have enhanced reliability against a magnitude of a current flowing therein. Reduced DC current like the embodiment of the present invention makes it possible to narrower the width of the delay line. Moreover, a narrowed transmission line makes it possible to shorten the transmission line to have the predetermined transmission impedance, which resultantly makes the circuit size smaller. In an example, narrowing the width from 20 μm to 10 μm, namely, a half of the original width, the length of the transmission line is able to be reduced from 240 μm to 140 μm, namely, about 40% downsizing.

(First Modification)

Figure 10:
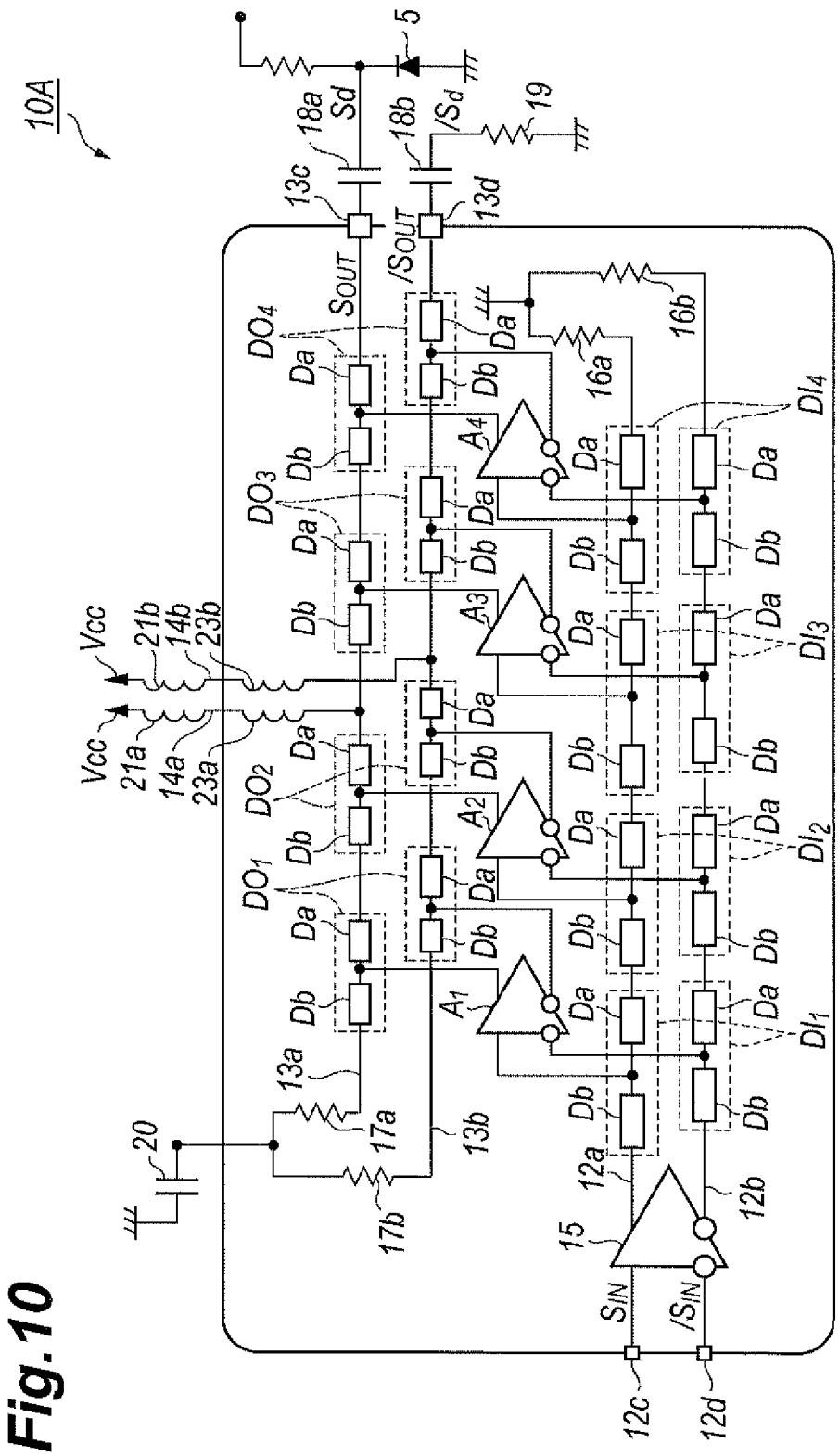
FIG. 10 shows a circuit diagram of a driver modified from the driver shown in FIG. 2.

FIG. 10 shows a circuit diagram of a driver 10A according to a modification of the aforementioned driver 10. The driver 10A has an arrangement substantially same with those of the aforementioned driver 10 shown in FIG. 2 except for features described below.

That is, the driver 10A provides power lines, 14a and 14b, accompanied with additional inductors, 23a and 23b, connected in series to the inductors, 21a and 21b. The former inductors, 23a and 23b, are preferably a type of the spiral inductor with inductance of about 1 nH. The additional inductors, 23a and 23b, are formed on the substrate made of, for instance, InP on which the other elements of the cells $A_i$, the pre-amplifier 15 and delay elements, Da and Db, are integrally formed.

Figure 11A:
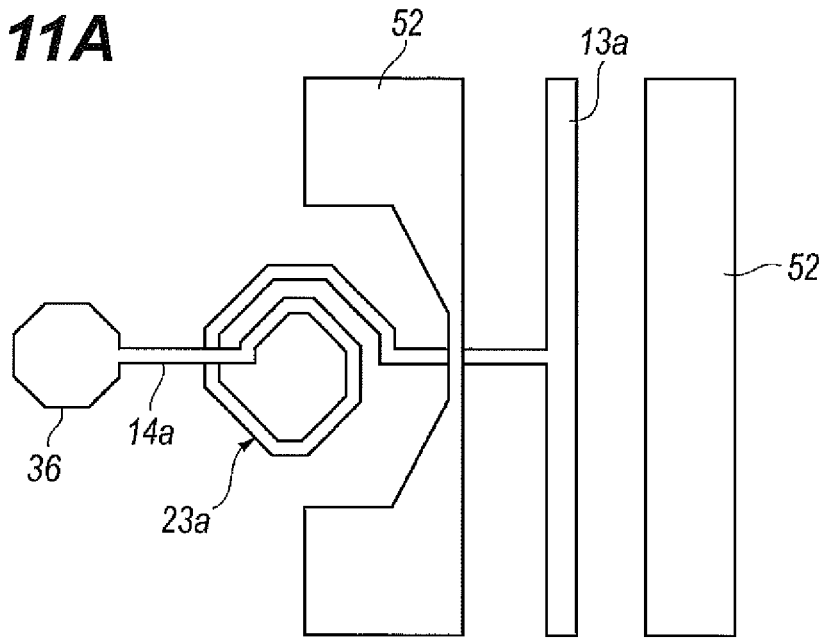
FIG. 11A is a magnified plan view of the power line with a spiral inductor and the output interconnection connected to the power line.
Figure 11B:
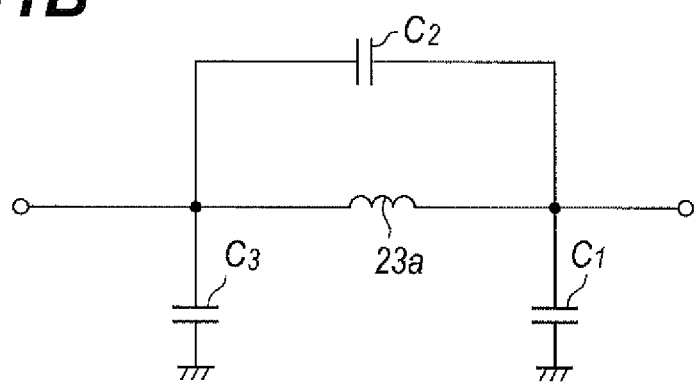
FIG. 11B shows an equivalent circuit diagram of the layout shown in FIG. 11A.

FIG. 11A is a plan view of a portion where the power line, 14a or 14b, is coupled with the output interconnection 13a or 13b, while, FIG. 11B shows an equivalent circuit of the power line 14a and the output interconnection 13a. FIG. 11A includes, in addition to the spiral inductor 23a and the output interconnection 13a, a bonding pad 36 to supply the electrical power on the output interconnection 13a and metal patterns 52 formed along the output interconnection 13a in both sides thereof.

The equivalent circuit includes, in addition to the spiral inductor 23a, parasitic capacitors, $C_1$ to $C_3$. The capacitor $C_1$ is a stray capacitance attributed to a line put from the output interconnection 13a to the bonding pad 36, the capacitor $C_2$ is a stray capacitance attributed to an aerial capacitor formed above the spiral inductor 23a and between the output interconnection 13a to the pad 36. The capacitor $C_3$ is attributed to the pad 36 itself against the ground, or the back surface of the InP substrate.

Figure 12A:
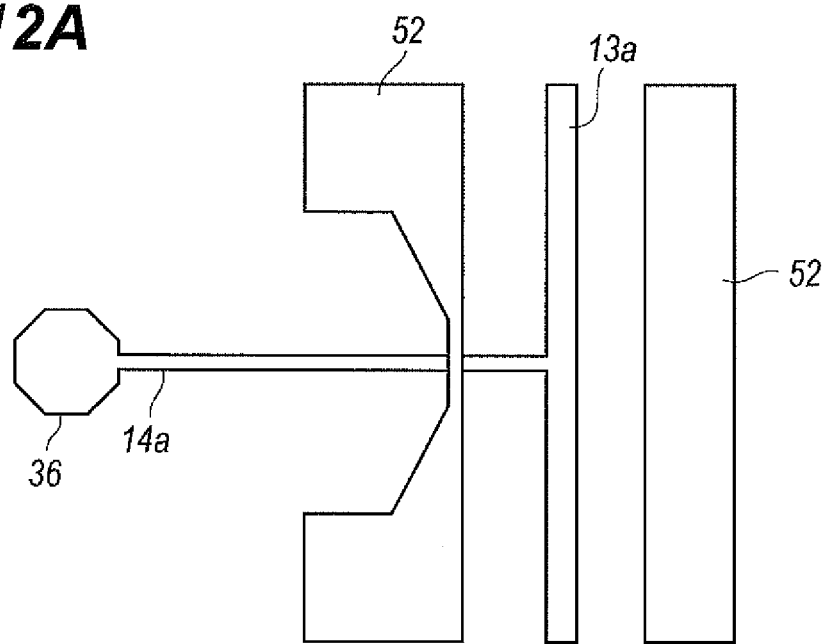
FIG. 12A is a magnified plan view of the power line without a spiral inductor and the output interconnection connected to the power line.
Figure 12B:
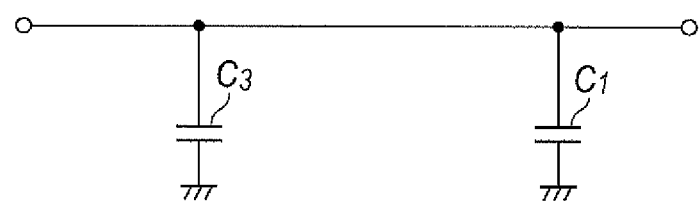
FIG. 12B shows an equivalent circuit diagram of the layout shown in FIG. 12A.
Figure 13:
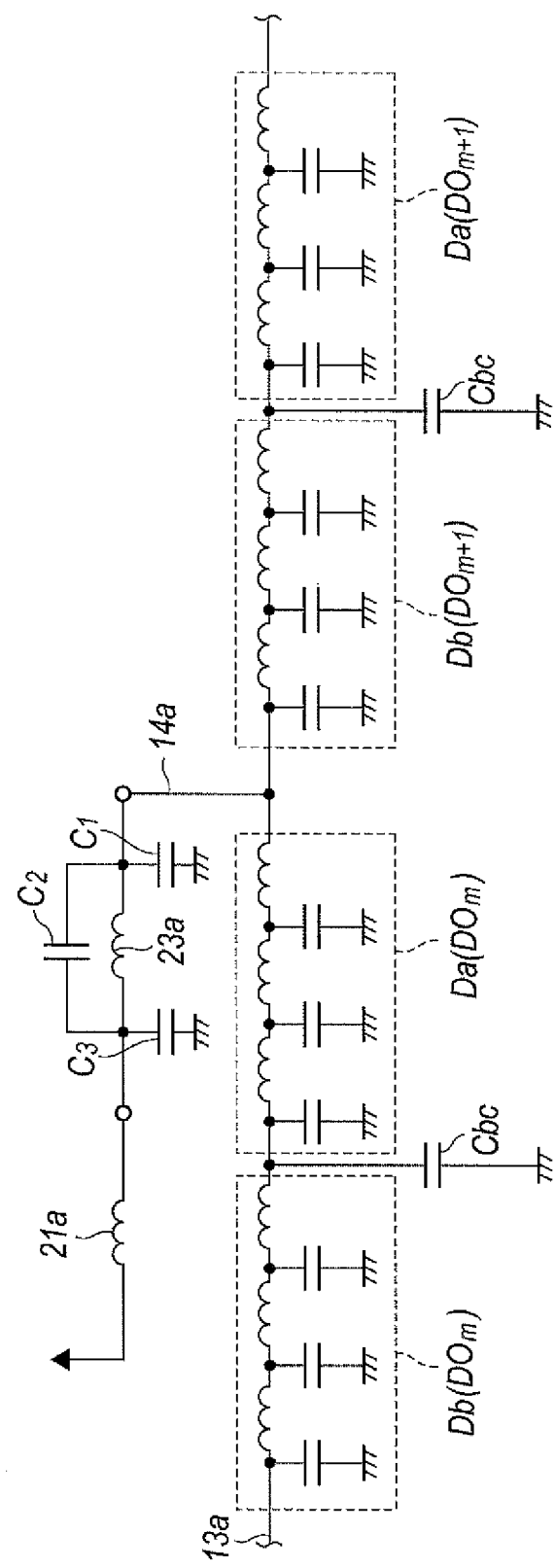
FIG. 13 shows an equivalent circuit diagram of the output interconnection combined with the equivalent circuit diagram of the power line with the spiral inductor shown in FIG. 11B.
Figure 14:
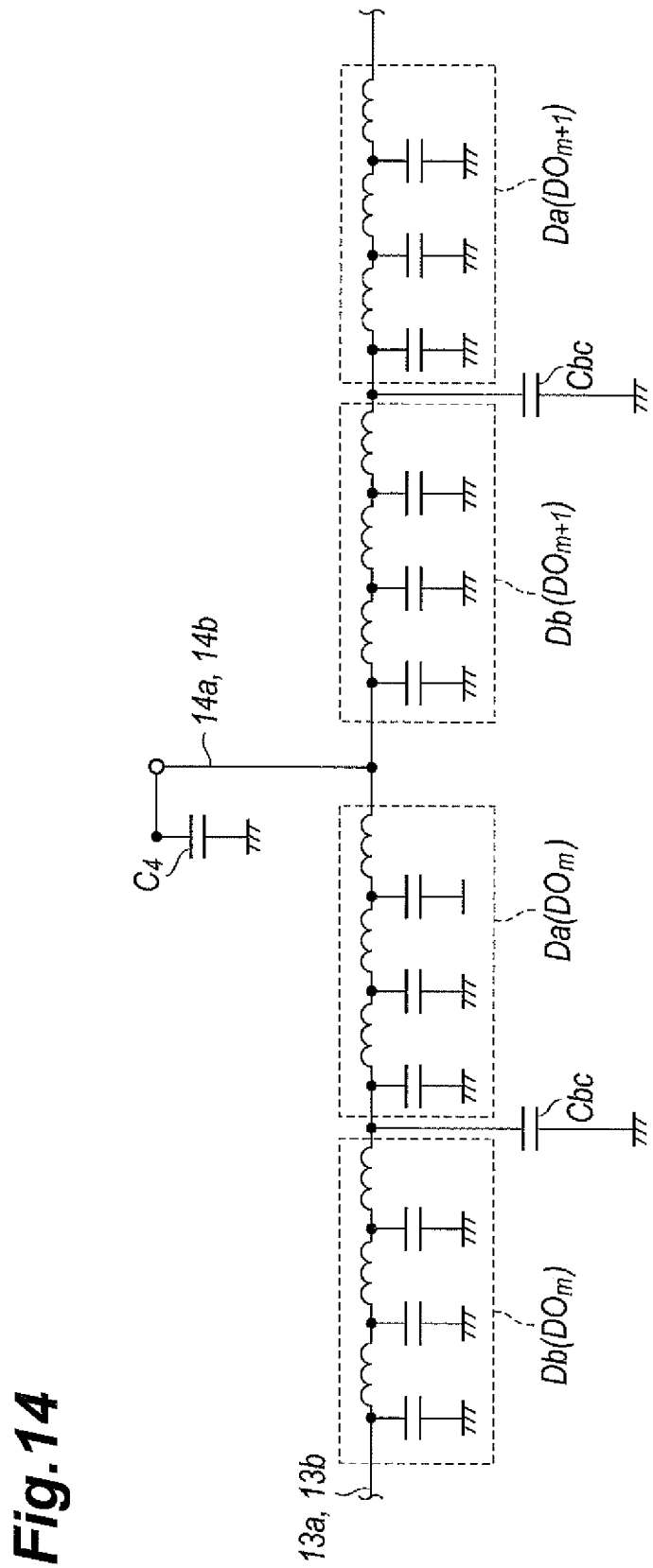
FIG. 14 shows an equivalent circuit diagram of the output interconnection combined with the power line without the spiral inductor.

FIG. 12A also shows a plan view of the portion of the power line 14a without any additional inductors, and FIG. 12B is an equivalent circuit of the layout shown in FIG. 12A. The equivalent circuit of FIG. 12B includes parasitic capacitors, $C_1$ and $C_3$. FIG. 13 combines the equivalent circuit shown in FIG. 11B and those for the output delay lines, $DO_m$ and $DO_{m+1}$, connected to the power line 14a. External inductors, 21a and 21b, where that latter is omitted in FIG. 13, and the spiral inductor 23a generally have large inductance to be regarded as an open-circuited in high frequencies compared with inductors attributed to the delay lines, $DO_m$ and $DO_{m+1}$. FIG. 14 is an equivalent circuit of the power line 14a and the output delay lines, $DO_m$ and $DO_{m+1}$, to regard the external inductors, 23a and 21a, in the open-circuited. The capacitor shown in FIG. 14 has capacitance of $$C_4=(C_1+C_2//C_3), \text{ and}$$

$$C_2//C_3=(C_2\times C_3)/(C_2+C_3).$$

That is, the power lines, 14a and 14b, are grounded in high frequencies through a capacitor C4 whose capacitance is given by the equation above. When the spiral inductor 23a is removed from the power line 14a, the capacitor $C_4$ has not the capacitance of the capacitor $C_2$, where $C_4$ becomes equal to $C_1+C_3$.

In the layout shown in FIG. 11A, because the capacitance of the capacitor $C_3$ attributed to the pad 36 becomes far greater than the capacitance $C_2$ for the overlay capacitor, namely, $C_3>C_2$; a condition of $(C_1+C_3)>(C_1+C_2//C_3)$ is satisfied. Then, the power lines, 14a and 14b, shown in FIG. 10 with additional inductors, 23a and 23b, have smaller capacitance compared with the power line 14a shown in FIG. 2 without any spiral inductors, 23a and 23b. Thus, the power lines, 14a and 14b, according to the modified embodiment shown in FIG. 10 give less influence, such as a variation of the transmission impedance of the output interconnections, 13a and 13b, and a fluctuation of the delay time of the delay lines, $DO_m$ and $DO_{m+1}$ compared with the arrangement without any additional inductors.

(Second Modification)

Figure 15:
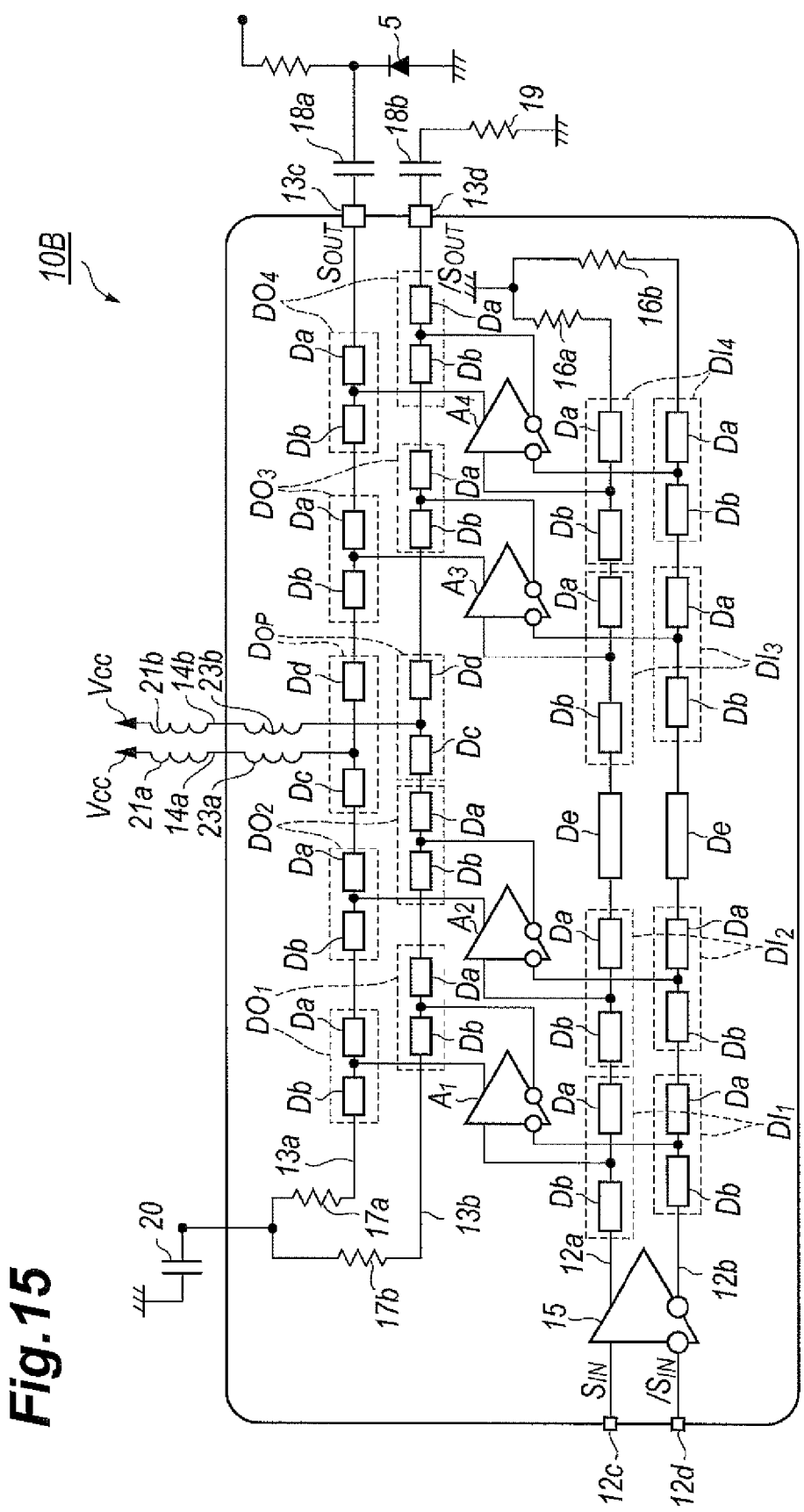
FIG. 15 shows a circuit diagram of a driver further modified from the driver shown in FIG. 10.

FIG. 15 shows a circuit diagram of a driver 10B further modified from the aforementioned driver 10A shown in FIG. 10. The driver 10B provides arrangements substantially same with those of the driver 10A except for points described below.

That is, the driver 10B further includes additional delay lines $D_{OP}$ in the output interconnections, 13a and 13b, to which the power lines, 14a and 14b, are connected. The additional delay line $D_{OP}$ has an arrangement similar to the output delay lines, $DO_1$ to $DO_N$; that is, the delay line $D_{OP}$ includes two delay elements, Dc and Dd, each being attributed to a delay time substantially same to each other. A sum of delay times for the delay elements, Dc and Dd, becomes a delay time of the additional delay line $D_{OP}$. The power lines, 14a and 14b, are connected to a node between two delay elements, Dc and Dd.

Figure 16:
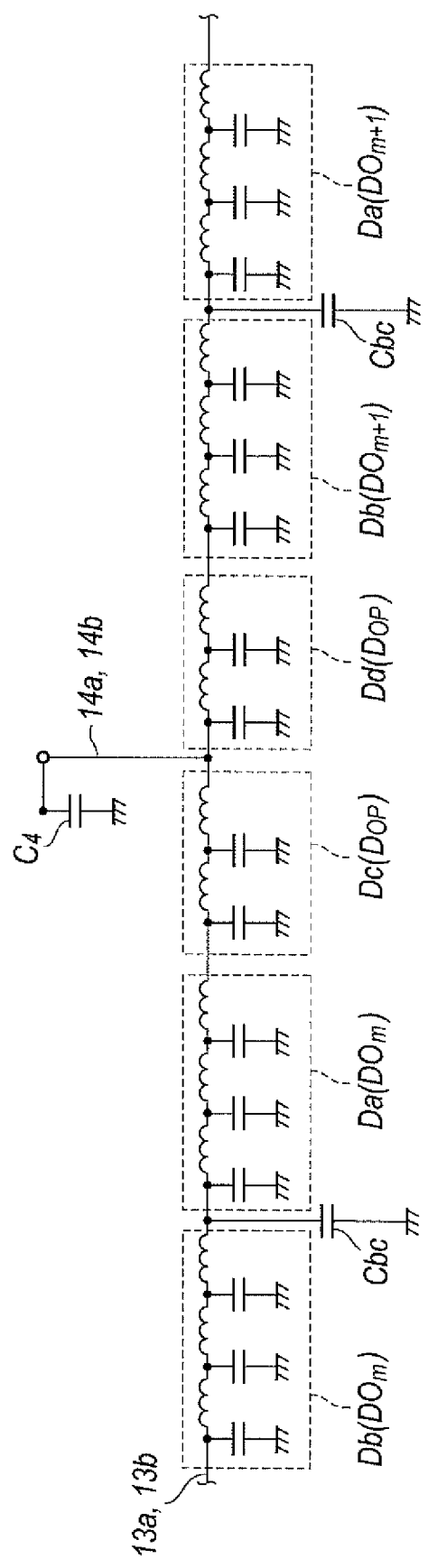
FIG. 16 shows an equivalent circuit diagram of the output interconnection shown in FIG. 15 combined with the power line without the spiral inductor.

FIG. 16 shows an equivalent circuit of the power lines, 14a and 14b, and the output interconnection, 13a and 13b, in a portion connected to the power lines, 14a and 14b. Comparing the equivalent circuit shown in FIG. 16 with that shown in FIG. 14, two delay elements, Dc and Dd, with the type of the co-planar line, are put between the power lines, 14a and 14b, inherently with the parasitic capacitor with the capacitance of $C_4=(C_1+C_2//C_3)$ and the output delay lines, $DO_2$ and $DO_3$. Then, a new transmission line constituted by the additional delay elements, Dc and Dd, and the parasitic capacitance $C_4$ is formed so as to have the predetermined impedance. Thus, the influence of the power lines, 14a and 14b, to the output interconnections, 13a and 13b, such as variations of the characteristic impedance of the output interconnections, 13a and 13b, and that of the delay times of the output delay lines, $DO_2$ and $DO_3$, is effectively suppressed compared with those of the aforementioned shown in FIG. 10.

The modified driver 10B shown in FIG. 15 provides still further delay element De between the input delay lines, $DI_2$ and $DI_3$, in the input interconnections, 12a and 12b. The delay element De is a type of the transmission line having predetermined transmission impedance of, for instance, 50Ω and a delay time substantially equal to the delay time of the delay lines $D_{OP}$ in the output interconnections, 13a and 13b. The delay element De in the input interconnections, 12a and 12b, adjust the phases of the signal amplified by the cells provided in the downstream of this delay element De so as to match the phase of signals amplified by respective cells, $A_1$ to $A_N$, at the output terminals, 13c and 13d.

Although the driver 10B shown in FIG. 15 provides additional inductors, 23a and 23b, in the power lines, 14a and 14b; the driver 10B may omit these additional inductors, 23a and 23b. The parasitic capacitor $C_4$ shown in FIG. 16 typically has capacitance of about 30 fF. In such a case, a length of the additional delay elements, Dc and Dd, putting the capacitor $C_4$ therebetween becomes about 300 μm to have the transmission impedance of 50Ω. On the other hand, a total length of the output interconnections, 13a and 13b, reaches a few millimeters to realize a substantial delay time between the cells. Accordingly, the additional delay elements, Dc to De, may be substantially ignorable in a viewpoint of the length of the interconnections.

In the foregoing detailed description, the driver for an optical modulator of the present invention has been described with reference to specific exemplary embodiments thereof. It will, however, be evident that various modifications and changes may be made thereto without departing from the broader spirit and scope of the present invention. For instance, the driver of the embodiments may directly driver a semiconductor laser diode. Moreover, the driver may be used as an amplifier with the TWA not restricted to applications to drive optical devices. The present specification and figures are accordingly to be regarded as illustrative rather than restrictive.

What is claimed is:

1. A driver for modulating light coming from an optical source, comprising:
   an input interconnection for propagating an input signal, the input interconnection providing first to N-th input delay lines connected in series, each of input delay lines having a delay time substantially equal to each other;
   an output interconnection for propagating amplified signals, the output interconnection providing first to N-th output delay lines connected in series, each of output delay lines having a delay time substantially equal to each other and equal to the delay time of the input delay line;
   first to N-th cells, wherein the n-th cell is connected to the n-th input delay line to receive the input signal and to the n-th output delay line to output the amplified signal to the n-th output delay line, where n is an integer between 1 and N;
   a power line for supplying electrical power to the output interconnection, the power line being connected between the m-th output delay line and (m+1)-th output delay line, where m is an integer between 2 to N−2,
   wherein each of the output interconnection and each of the input interconnection further include an additional delay line between the m-th output delay line and the (m+1)-th output delay line, and the m-th input delay line and the (m+1)-th delay line, respectively, where m is an integer between 2 to N−2, the additional delay line in the output interconnection having a delay time equal to a delay time of the additional delay line in the input interconnection, and
   wherein the power line is connected to the additional delay line in the output interconnection.

2. The driver of claim 1,
   wherein the additional delay line of the output interconnection provides a first delay element and a second delay element connected in series to the first delay element, and
   wherein the power line is connected between the first and second delay elements of the additional delay line in the output interconnection.

3. The driver of claim 1,
   wherein each of cells, each of the input interconnections, each of the output interconnections, and the power line have a differential arrangement.

4. The driver of claim 1,
   wherein each of the cells is connected to the output delay line by an open collector arrangement.

5. A driver for modulating light coming from an optical source, comprising:
   an input interconnection for propagating an input signal, the input interconnection providing first to N-th input delay lines connected in series, each of input delay lines having a delay time substantially equal to each other;
   an output interconnection for propagating amplified signals, the output interconnection providing first to N-th output delay lines connected in series, each of output delay lines having a delay time substantially equal to each other and equal to the delay time of the input delay line;
   first to N-th cells, wherein the n-th cell is connected to the n-th input delay line to receive the input signal and to the n-th output delay line to output the amplified signal to the n-th output delay line, where n is an integer between 1 and N;

a power line for supplying electrical power to the output interconnection, the power line being connected between the m-th output delay line and (m+1)-th output delay line, where m is an integer between 2 to N−2, wherein m is equal to N/2 where N is an even integer, and wherein m is equal to N/2 or N/2+1 where N is an odd integer.

6. A transmitting module, comprising:

an optical source including a semiconductor laser diode to emit continuous light;

an optical modulator to modulate the continuous light emitted from the semiconductor laser diode; and a driver configured with a travelling wave amplifier, wherein the driver includes, an input interconnection including first to N-th input delay lines connected in series, an output interconnection including first to N-th output delay lines connected series, first to N-th cells, wherein the n-th cell is connected between the n-th input delay line and the n-th output delay line, where n is and integer between 1 to N, and a power line connected between m-th output delay line and (m+1)-th output delay line, where m is an integer greater than 1 but less than N−1, to supply electrical power to the cells.

7. The transmitting module of claim 6, wherein m is equal to N/2 where N is an even integer.

8. The transmitting module of claim 6, wherein m is equal to N/2 or N/2+1 where N is an odd integer.

9. The transmitting module of claim 6, wherein each of the input delay lines and the output delay lines includes a first delay element and a second delay element, the first delay element being attributed to a delay time substantially equal to a delay time attributed to the second delay element.

10. The transmitting module of claim 6, wherein the power line includes an inductor whose impedance enough large not to affect impedance of the output transmission line.

11. The transmitting module of claim 10, wherein the inductor is a spiral inductor.

12. The transmitting module of claim 10, wherein each of the output interconnection and the input interconnection has an additional delay line attributed to a delay time equal to each other, the additional delay line of the output interconnection being connected between the m-th output delay line and the (m+1)-th delay line, and the additional delay line of the input delay line being connected between the m-th input delay line and the (m+1)-th input delay line, and wherein the power line is connected to the additional delay line in the output interconnection.

13. The transmitting module of claim 12, wherein the additional delay line in the output interconnection includes a first delay element and a second delay element connected in series to each other, the power line being connected between the first element and the second delay element of the additional delay line in the output interconnection, and wherein the first delay element and the second delay element have an accumulative delay time substantially equal to a delay time of the additional delay line in the input interconnection.

* * * * *